Figure 1:
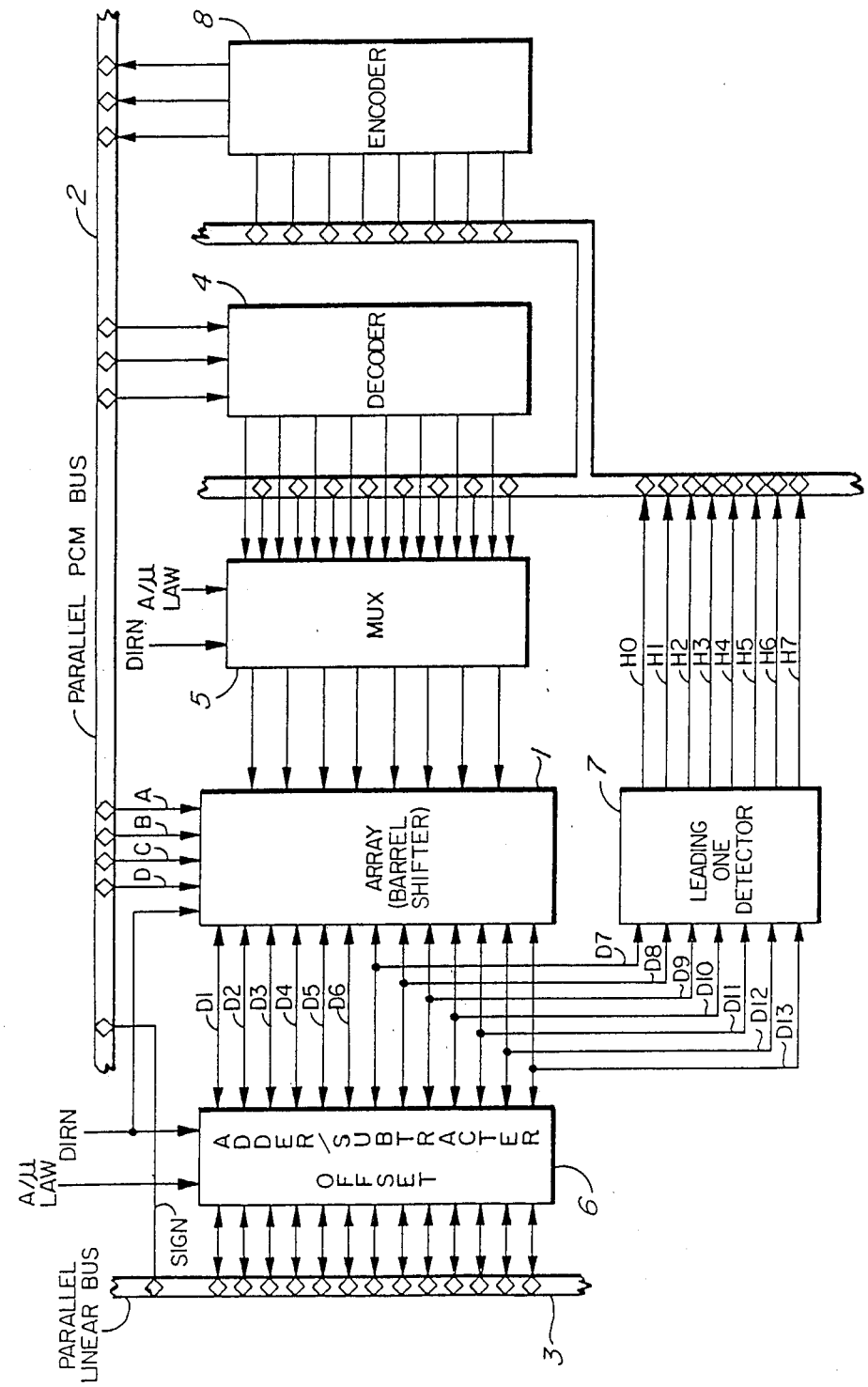

United States Patent [19]

Skubnik

[11] Patent Number: 4,740,993

[45] Date of Patent: Apr. 26, 1988

[54] DIGITAL COMPANDING CIRCUIT

[75] Inventor: Milan Skubnik, Nepean, Canada

[73] Assignee: Mitel Corporation, Ontario, Canada

[21] Appl. No.: 907,584

[22] Filed: Sep. 15, 1986

[30] Foreign Application Priority Data

Feb. 25, 1986 [CA] Canada .................................. 502658

[51] Int. Cl.[4] ........................................... H04B 14/06
[52] U.S. Cl. ............................................ 375/30; 370/7
[58] Field of Search ........................ 375/30, 122, 251; 358/133, 135; 370/50, 7; 381/34

[56] References Cited

U.S. PATENT DOCUMENTS

| | | | |
|---|---|---|---|
| 3,435,134 | 3/1969 | Richards | 375/122 |
| 4,339,818 | 7/1982 | Gruenberg | 375/122 |
| 4,386,237 | 5/1983 | Virupaksha et al. | 375/112 |
| 4,507,792 | 3/1985 | Yamakido et al. | 375/30 |
| 4,513,279 | 4/1985 | Kapral | 370/30 |
| 4,610,018 | 9/1986 | Rabaey et al. | 375/30 |
| 4,661,946 | 4/1987 | Takahashi et al. | 370/50 |

Primary Examiner—Robert L. Griffin
Assistant Examiner—Stephen Chin
Attorney, Agent, or Firm—Laff, Whitesel, Conte & Saret

[57] ABSTRACT

A circuit for companding digital signals, incorporating a bidirectional barrel shifter in the form of an array of transmission gate cells for shifting step bits of a compressed PCM signal a predetermined number of locations to the left in response to the magnitude of chord bits thereof. The shifted bits are applied to a linear digital signal bus in the form of an expanded linear representation of the PCM signal. Linear digital signals appearing on the linear bus are compressed via shifting to the right through the barrel shifter and are applied therefrom to a PCM signal bus. The companding circuit is inexpensive, can accommodate both A-law and $\mu$-law PCM protocols, is fully static and operates at high speed.

41 Claims, 4 Drawing Sheets

DIGITAL COMPANDING CIRCUIT

This invention relates in general to digital signal transmission, and more particularly to a circuit for companding digital audio signals.

Modern day communication systems are frequently required to arithmetically manipulate pulse code modulated (PCM) digital signals, for effecting gain adjustment, etc. PCM signals are typically in the form of eight bit floating point compressed representations of audio signals. In order to perform direct arithmetic operations on the signals, the PCM signals must typically first be expanded to thirteen or fourteen bit linear representations thereof. Similarly, linear digital audio signals are typically required to be compressed into logarithmic PCM representations prior to transmission through the communication system.

Prior art techniques for companding digital signals typically incorporated serial circuitry for converting the compressed PCM signals to linear signals, and vice versa. The serial techniques typically utilized complex timing circuitry for controlling the conversion process. Also, the conversion process typically required considerable time for implementation since the serial bits were processed or manipulated individually instead of being pipelined in a parallel format.

According to the present invention, digital signals are compressed and expanded (companded) via a single inexpensive circuit. The circuit accommodates both A-law and $\mu$-law PCM protocols, is fully static and according to a successful embodiment, has been implemented in CMOS.

PCM signals conforming to CCITT recommendations G172, G711, G712$\mu$ and G732A are comprised of eight bit words each including a sign bit, a three bit exponent portion (chord) and a four bit mantissa portion (step).

According to the present invention, a circuit is provided for separating a compressed PCM word into its three components; the sign bit, chord and step bits, and expanding the separated components into a linear signed magnitude representation of the PCM word. During expansion, the step bits are shifted to the left by a number of locations proportional to the magnitude of the chord bits, and the step bits are surrounded or "padded" by logic high level signals.

During the process of compression, the order of the linear signal to be compressed is ascertained by means of detecting the position of the most significant non-zero bit of the linear signal and designating the adjacent four bits to the left of the aforementioned most significant bit as representing the step bits, while encoding the order of the most significant non-zero bit into a corresponding set of three chord bits.

A four bit barrel shifter may be utilized according to the preferred embodiment, for performing the aforementioned conversion. Barrel shifters are well known circuits for transforming an input digital word having a predetermined number of bits into a further digital word in the form of a shifted representation of the input word. Various barrel shifter configurations are well known, including shifters which expand input words into words having a greater number of bits, or "wraparound" shifters which shift a most significant bit of a digital word to the least significant bit location of the output word while shifting each of the remaining bits one location to the left. Such well known configurations are discussed, for instance, in the Carver and Mead textbook "Introduction to VLSI Systems" (1980), Addison Wesley Publishing Company, Inc., p. 157–163.

Advantageous properties of the barrel shifter are its bidirectionality and parallel processing format. The barrel shifter is used for both compression of linear signals as well as expansion of PCM words via parallel processing, resulting in a high speed and low cost circuit which overcomes the disadvantages of prior art expensive and slow comparatively serial companding circuits.

According to a successful prototype, a six bit barrel shifter was used for shifting the four step bits and surrounding (padding) the step bits with logic high level signals.

Figure 2:
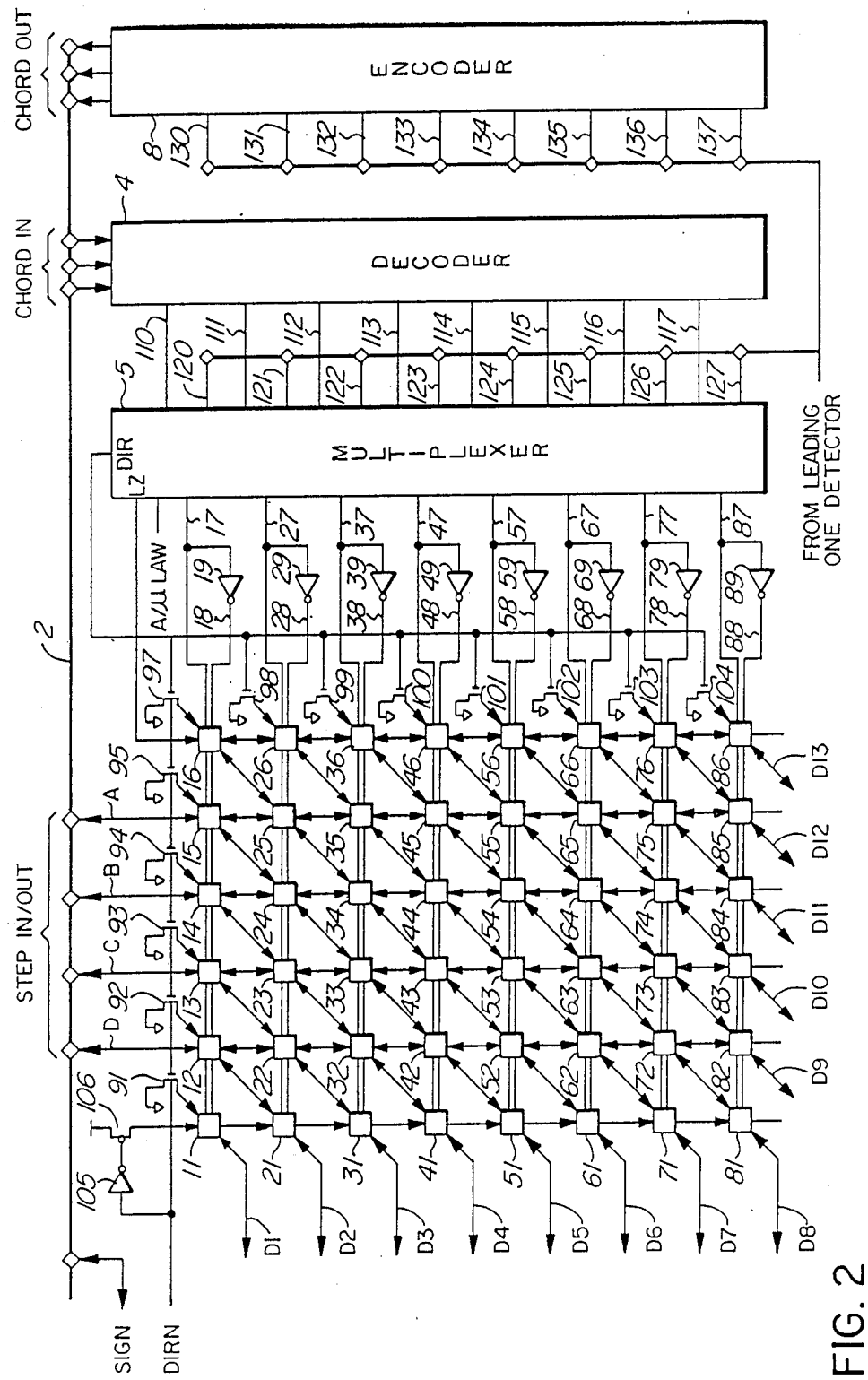
Figure 3:
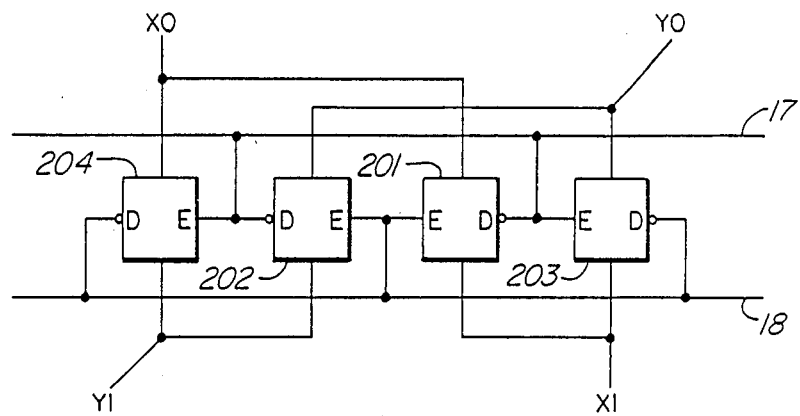
Figure 4:
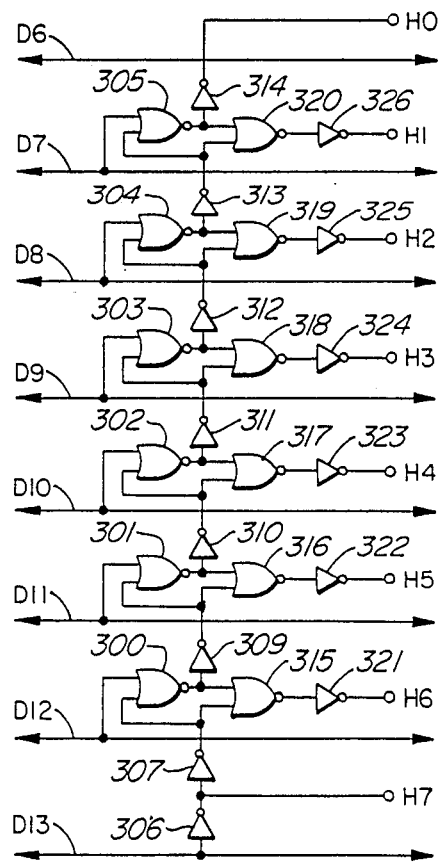
Figure 5:
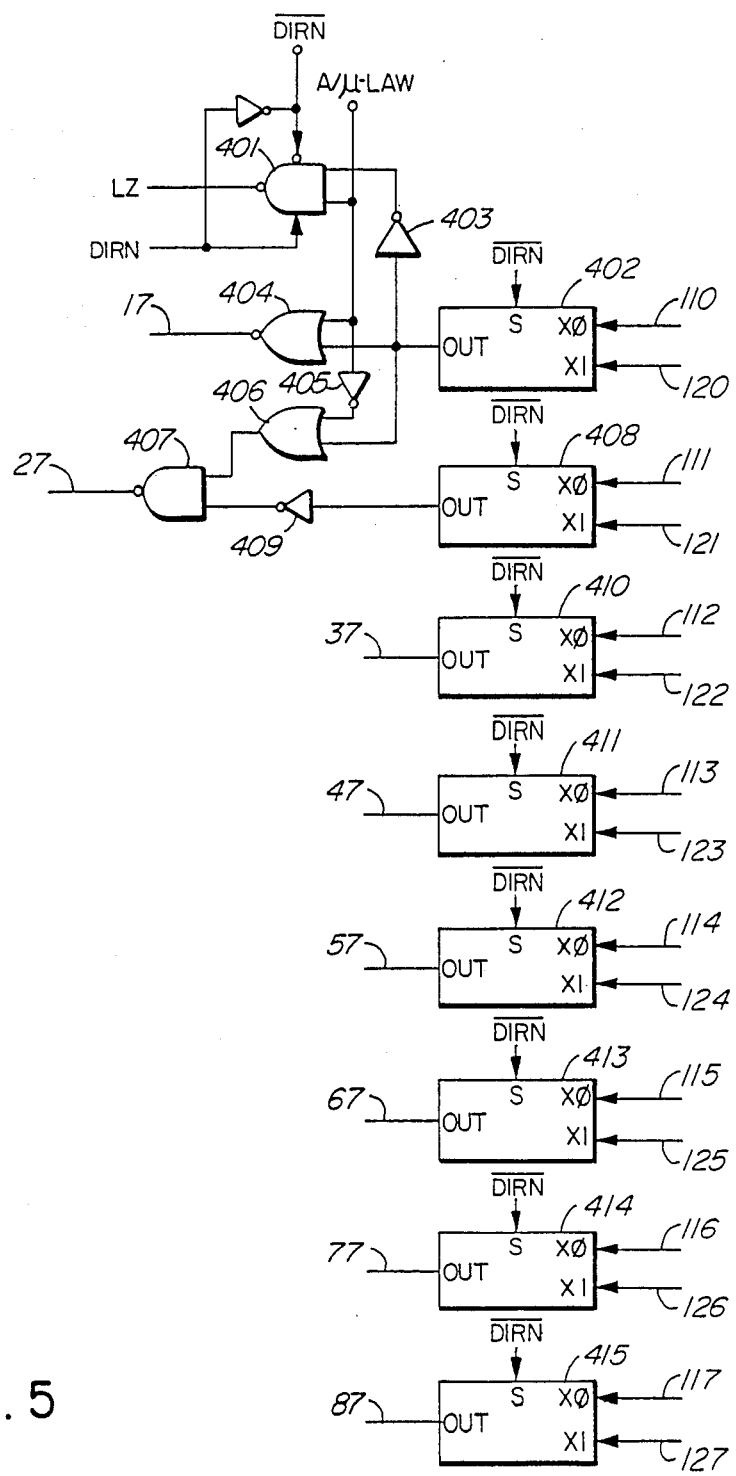

A better understanding of the invention will be obtained with reference to the detailed description below in conjunction with the following drawings, in which:

FIG. 1 is a block diagram of a companding circuit according to the present invention in its broadest form, FIG. 2 is a schematic block diagram of array circuitry according to the preferred embodiment of the present invention, FIG. 3 is a schematic diagram of a cell element according to the array circuitry illustrated in FIG. 2, FIG. 4 is a schematic diagram of circuitry for detecting a leading one bit according to the preferred embodiment, and FIG. 5 is a schematic diagram of multiplexer circuitry according to the preferred embodiment.

With reference to FIG. 1, a barrel shifter, in the form of an array 1 receives four step bits denoted as A, B, C and D, of a PCM word from a parallel PCM bus 2, and shifts the step bits to form one of either a twelve or thirteen bit linear word (depending on whether the input PCM word was A-law or $\mu$-law encoded), for application to a parallel linear bus 3.

The sign bit of a PCM word appearing on parallel PCM bus 2 is applied directly to the parallel linear bus 3. Chord bits received from the PCM bus 2 are applied to a decoder 4 which in response generates a control signal on one of eight outputs thereof for application to a multiplexer circuit 5. In response, multiplexer circuit 5 generates an enable signal on a predetermined one of eight output terminals thereof for application to the array 1, thereby causing the four step bits to be shifted a predetermined number of locations to the left therein, as discussed in greater detail below with reference to FIG. 2.

An external controller, such as a microprocessor (not shown) generates a pair of control signals DIRN and A/$\mu$-law for application to the array 1, multiplexer 5 and an offset adder/subtracter circuit 6. The value of the DIRN signal designates the function of the companding circuit as being one of either a PCM-to-linear word expander or a linear-to-PCM word compressor. The A/$\mu$-law control signal selects the function of the present circuit for companding one of either A-law or $\mu$-law encoded PCM words, (i.e. an offset value of thirty-three must be subtracted during expansion and added during compression of $\mu$-law words, via offset adder/subtracter circuit 6, discussed in greater detail below).

The four step bits are shifted during expansion by the aforementioned predetermined number locations to the left and appear on a plurality of bidirectional terminals of the array 1 for application to offset adder/subtracter circuit 6. Internal circuitry of the array 1 generates a pair of logic high level signals on the terminals immediately adjacent the terminals carrying the four step bits. Array 1 forces the remaining bits of the linear word to logic low levels.

In order to convert from a μ-law encoded PCM word to a linear representation thereof, an offset value of thirty-three is required to be subtracted from the expanded linear digital word, corresponding to the subtraction of a half-step set-up correction value for the mid-rise quantizing step at the zero crossing of the μ-law to linear conversion curve, well known to persons skilled in the digital communication arts. The offset value is added to the linear digital word during compression, (i.e. encoding of the PCM signal).

Accordingly, the shifted bits appearing on the bidirectional terminals of array 1 are applied to offset adder/subtracter circuit 6 and an offset value of thirty-three is subtracted therefrom. The sum signal is then applied to parallel linear bus 3 for further processing, such as gain scaling adjustment, etc., by additional digital signal processing circuitry, which does not form part of the present invention.

In the event A-law encoded PCM words are being expanded, the external processor generates a logic high level A/μ-law signal for application to offset adder/subtracter 6, which in response becomes transparent to the shifted bits appearing on the bidirectional terminals of array 1.

During compression, a linear word appearing on parallel linear bus 3, is applied to offset adder/subtracter 6, and in the event of μ-law encoded compression, the aforementioned offset value of thirty-three is added thereto. The most significant bits of the linear word are applied to a leading one detector circuit 7 for detecting the most significant non-zero bit thereof. Leading one detector 7 has eight outputs connected to eight respective inputs of multiplexer 5 and an eight-to-three bit encoder circuit 8. Detector circuit 7 generates a control signal indicative of the location of the most significant non-zero bit of the linear word.

The external controller generates a logic low level DIRN control signal for application to the offset adder/subtracter 6, array 1 and multiplexer 5. In response, multiplexer 5 receives the control signal from leading one detector circuit 7, and enables predetermined cells of array 1 such that the least significant four bits adjacent to the detected most significant bit are extracted via shifting through array 1 and applied to PCM bus 2, as discussed in greater detail below with reference to FIG. 2.

Also, the control signal from the leading one detector 7 is encoded in circuit 8 which in response generates three chord bits for application to parallel PCM bus 2. The sign bit from parallel linear bus 3 is applied directly to parallel PCM bus 2, as discussed above.

The aforementioned barrel shifting of digital signals applied to array 1 is illustrated in TABLES 1 and 2, as follows:

TABLE 1

(A-law)

| CHORD | LINEAR SIGNAL | | | | | | | | | | | PCM SIGNAL | | | | | | |
|---|---|---|---|---|---|---|---|---|---|---|---|---|---|---|---|---|---|---|
| 0 | 0 | 0 | 0 | 0 | 0 | 0 | 0 | A | B | C | D | 1 | 0 | 0 | 0 | A | B | C | D |
| 1 | 0 | 0 | 0 | 0 | 0 | 0 | 1 | A | B | C | D | 1 | 0 | 0 | 1 | A | B | C | D |
| 2 | 0 | 0 | 0 | 0 | 0 | 1 | A | B | C | D | 1 | X | 0 | 1 | 0 | A | B | C | D |
| 3 | 0 | 0 | 0 | 0 | 1 | A | B | C | D | 1 | X | X | 0 | 1 | 1 | A | B | C | D |
| 4 | 0 | 0 | 0 | 1 | A | B | C | D | 1 | X | X | X | 1 | 0 | 0 | A | B | C | D |
| 5 | 0 | 0 | 1 | A | B | C | D | 1 | X | X | X | X | 1 | 0 | 1 | A | B | C | D |
| 6 | 0 | 1 | A | B | C | D | 1 | X | X | X | X | X | 1 | 1 | 0 | A | B | C | D |
| 7 | 1 | A | B | C | D | 1 | X | X | X | X | X | X | 1 | 1 | 1 | A | B | C | D |

TABLE 2

(μ-law)

| CHORD | LINEAR SIGNAL | | | | | | | | | | | | PCM SIGNAL | | | | | | |
|---|---|---|---|---|---|---|---|---|---|---|---|---|---|---|---|---|---|---|---|
| 0 | 0 | 0 | 0 | 0 | 0 | 0 | 0 | 1 | A | B | C | D | 1 | 0 | 0 | 0 | A | B | C | D |
| 1 | 0 | 0 | 0 | 0 | 0 | 0 | 1 | A | B | C | D | 1 | X | 0 | 0 | 1 | A | B | C | D |
| 2 | 0 | 0 | 0 | 0 | 0 | 1 | A | B | C | D | 1 | X | X | 0 | 1 | 0 | A | B | C | D |
| 3 | 0 | 0 | 0 | 0 | 1 | A | B | C | D | 1 | X | X | X | 0 | 1 | 1 | A | B | C | D |
| 4 | 0 | 0 | 0 | 1 | A | B | C | D | 1 | X | X | X | X | 1 | 0 | 0 | A | B | C | D |
| 5 | 0 | 0 | 1 | A | B | C | D | 1 | X | X | X | X | X | 1 | 0 | 1 | A | B | C | D |
| 6 | 0 | 1 | A | B | C | D | 1 | X | X | X | X | X | X | 1 | 1 | 0 | A | B | C | D |
| 7 | 1 | A | B | C | D | 1 | X | X | X | X | X | X | X | 1 | 1 | 1 | A | B | C | D | where X = don't care when compressing
0 = don't care when expanding

As seen from Tables 1 and 2, A-law compressed words are expanded to 12 bit linear words while μ-law compressed words are expanded to 13 bit linear words. The circuitry by which 12 or 13 bit PCM to linear conversion is accommodated within array 1, is discussed in greater detail below with reference to FIG. 5.

In order to better understand the invention, consider the following example of expansion of an input μ-law word having a value of 1 0 1 0 1 0 1 0, carried by PCM bus 2. The logic high level sign bit is applied directly from the parallel PCM bus 2 to the parallel linear bus 3, the three bit chord signal 0 1 0 is applied to decoder circuit 4 and the four bit step portion 1 0 1 0 is applied to array 1.

With reference to Table 2, it is seen that the thirteen bit linear word output from array 1 will be of the form 0 0 0 0 0 1 1 0 1 0 1 0 0. This thirteen bit quasi-linear signal is applied to the offset adder/subtracter 6 and subtracted to the value of thirty-three (1 0 0 0 0 1 binary) therein, yielding a quasi-linear, or biased linear digital word of the form 0 0 0 0 0 1 0 1 1 0 0 1 1, which is then applied to linear bus 3 for further binary arithmetic manipulation, such as gain conversion, digital filtering, etc.

Next, consider the following example of the A-law compression of a linear word of the form 1 0 0 1 1 0 1 0 1 0 1 1 0 carried by the parallel linear bus 3. The most significant logic high level sign bit is applied directly from the parallel linear bus 3 to the parallel PCM bus 2. Leading one detector 7 detects the most significant high level bit of the linear word as being in the third most significant location (not including the sign bit). Accordingly, leading one detector circuit 7 generates an eight bit control signal of the form 0 0 1 0 0 0 0 0 for application to multiplexer 5 and encoder circuit 8. In response, encoder circuit 8 generates three chord bits as follows; 1 0 1, and multiplexer 5 generates a control signal for causing the four least significant bits adjacent to the leading one bit (i.e. the bits 1 0 1 0) to be shifted through the array 1 and applied to the parallel PCM bus 2. Accordingly, an output compressed A-law PCM word is applied to parallel PCM bus 3 of the form 1 1 0 1 1 0 1 0.

Referring to FIG. 2, the construction of array 1 is shown in detail, as being comprised of a plurality of transmission gate cells denoted as 11-16, 21-26, 31-36, 41-46, 51-56, 61-66, 71-76 and 81-86. The array 1 is arranged as eight rows each comprised of six transmission gate cells. Each row is connected to a corresponding enable line 17, 27, 37, 47, 57, 67, 77 and 87 respectively, each of which is connected to a predetermined output of multiplexer 5. Additional enable lines 18, 28, 38, 48, 58, 68, 78 and 88 are connected to corresponding ones of the rows of transmission gate cells and to enable lines 17, 27, 37, 47, 57, 67, 77 and 87 via respective inverters 19, 29, 39, 49, 59, 69, 79 and 89.

The construction and operation of individual ones of the transmission gate cells will be discussed in greater detail below with reference to FIG. 4.

The aforementioned control signal DIRN generated by the external controller, is applied to gate inputs of transistors 91-104 and to the DIR control input of multiplexer 5. Source terminals of transistors 91-97 are connected to bidirectional diagonal ports of cells 11-16, respectively. The source terminals of transistors 98-104 are connected to diagonal ports of cells 26, 36, 46, 56, 66, 76 and 86 respectively. The drain terminals of transistors 91-104 are all connected to ground.

Decoder 4 is typically a three-to-eight bit decoder, of well known design, and encoder 8 is typically an eight-to-three bit encoder of well known design. Multiplexer 5 selects control lines 110-117 originating from decoder 4 for controlling the array 1 (FIG. 1) in response to receiving a logic high level DIRN signal on the DIR terminal thereof from the external processor, resulting in expansion of a PCM word. Similarly, multiplexer 5 selects control lines 120-127 for controlling array 1 to effect compression of a linear word, in response to receiving a logic low DIRN signal on the DIR terminal.

The DIRN control signal is also connected via an inverter 105 to a disable input of transmission gate 106. One terminal of gate 106 is connected to a logic high level voltage source, and the remaining terminal is connected to transmission gate cell 11.

An output L2 of multiplexer 5 is connected to transmission gate cell 16 for causing the most significant adjacent bit to the "A" step bit in an expanded A-law signal (Table 1) to be one of either a logic high or a logic low level. In particular, in the event of expansion of an A-law PCM word having chord bits as follows; 0 0 0, LZ=0, otherwise LZ=1.

In operation, as described above with reference to FIG. 1, multiplexer 5 generates a logic high enable signal on one of enable lines 17, 27, 37, 47, 57, 67, 77, 87 in response to receiving control signals from one of either decoder 4 or leading one detector 7.

In the event of a logic low level signal being applied to the enable line of any of the rows of transmission gate cells, (e.g. enable line 17), the four step bits received from parallel PCM bus 2 and applied to respective transmission gate cells (e.g. 12-15) are shifted vertically to adjacent cells (e.g. 22-25). Similarly, signals appearing on the diagonal terminals of a predetermined one or more of the rows of cells are diagonally translated or shifted so as to appear on respective adjacent diagonal cells.

However, as noted above, one of the enable lines will be at a logic high level, resulting in bits which are applied to the top vertical terminals of a predetermined one of the rows to be diverted so as to appear on the respective bottom diagonal terminals, for application to adjacent diagonal cells. Also, signals appearing on the bottom vertical terminals are shifted so as to appear on respective top diagonal terminals of the row cells. Thus, each of the bits carried by cells of the enabled row are shifted downwardly and to the left of the array 1 in the event of expansion of a PCM word, and to the right and upwardly through the enabled row of cells in the event of PCM encoding or compression of a linear word.

In the event of expansion of a PCM word, the DIRN control signal from the external controller is at a logic high level, causing transistors 91-104 and transmission gate 106 to be enabled. Thus, step bits appearing on the parallel PCM bus 2 are applied to cells 12-15 and logic high level signals are applied via transmission gate 106 and the LZ output of multiplexer 5 to transmission gate cells 11 and 16 respectively. Accordingly, logic low levels signals are transmitted diagonally through the disabled rows of cells from corresponding ones of transistors 91-104 such that the linear word appearing on parallel linear bus 3 contains a plurality of zeros in the least significant bits adjacent to the shifted step bits, while the bits immediately adjacent the most and least significant bits of the step bits are at logic high levels.

For example, in the event the fourth row of cells was enabled during expansion in response to a logic high level signal being carried by control line 47, the logic high level signals translated through gate 106 and appearing on the LZ output would be transmitted through gates 11, 21, 31, 41 and 16, 26, 36, 46, 55, 64, 73, 82 respectively, to appear on the D4 and D9 bidirectional terminals of array 1, respectively. Similarly, the step bits applied to gates 12-15 would be translated so as to appear on the D5-D8 terminals respectively. Also, logic low signals translated through transistors 91-93 would be shifted diagonally so as to appear on terminals D1-D3 respectively, while the remaining logic low level signals applied to source terminals of transistors 94-100 would be diverted to the unconnected vertical bottom terminals of gates 81-86 respectively, and the logic low level signals from transistors 101-104 would be translated diagonally so as to appear on terminals D10-D13 respectively.

Turning to FIG. 3, the internal circuitry of one of the transmission gate cells, (e.g. cell 16), is shown in detail. Enable signal line 17 is connected to the disable inputs of transmission gates 201 and 202, and to the enable inputs of transmission gates 203 and 204. The inverted enable signal line 18 is connected to disable inputs of gates 203 and 204, and to the enable inputs E, of gates 201 and 202.

In operation, a logic high level signal appearing on enable signal line 17 (and a complementary logic low level signal appearing on line 18) enables gates 203 and 204 such that the X0 and Y1 terminals are interconnected, and the Y0 and X1 terminals are interconnected. This results in a diverted shift of digital signal bits through the cell, as described above with reference to FIG. 2.

In the event of a logic low level signal appearing on enable line 17 (and a complementary logic high level signal appearing on enable line 18), gates 201 and 202 are enabled such that the X0 and X1 terminals are interconnected, and the Y0 and Y1 terminals are interconnected. This results in vertical translation of digital signal bits appearing on the X0 and X1 terminals, and simultaneous diagonal translation of signals appearing on the Y0 and Y1 terminals.

Since transmission gates 201-204 are bidirectional in nature, the array 1 may be utilized for effecting both the expansion and compression of digital signals.

With reference to FIG. 4, the leading one detector circuit is shown in detail. The first inputs of a plurality of NOR gates 300, 301, 302, 303, 304 and 305 are connected to bidirectional data lines D12-D6 respectively. An input of inverter 306 is connected to data line D13 and an output thereof is connected to control terminal H7 and to the input of an inverter 307.

The output of inverter 307 is connected to the second input of NOR gate 300. The outputs of NOR gates 300-305 are connected to first inputs of inverters 309-314 respectively, and to first inputs of NOR gates 315-320 respectively. Outputs of inverters 307-313 are connected to respective second inputs of NOR gates 315-320, and the output of inverter 314 is connected to control terminal H0. The outputs of NOR gates 315-320 are connected via respective inverters 321-326 to respective control terminals H6-H1.

In operation, consider a linear word having data bits D6-D13 of the form 0 0 1 1 0 1 0 0. Thus, the most significant logic high level bit is carried by the D11 data line. Since the D13 line carries a logic low level signal, the output of inverter 306 is at a logic high level such that the H7 output terminal is also at a logic high level.

The output of inverter 307 generates a logic low level signal which is applied to the second input of NOR gates 300 and 315. The first input of NOR gate 300 has a logic low level signal applied thereto from data line D12 such that the output thereof carries a logic high level signal. Thus, NOR gate 315 generates a logic low level signal which is inverted in inverter 321 such that output terminal H6 carries a logic high level signal.

The output of inverter 309 carries a logic low level signal which is applied to the second inputs of NOR gates 301 and 316. The first input of NOR gate 301 has a logic high level signal applied thereto such that the output of NOR gate 301 generates a logic low level signal. Accordingly, the output of NOR gate 316 generates a logic high level signal, which is inverted in NOR gate 322 such that the H5 control terminal carries a signal having a logic low level.

The output of inverter 310 generates a logic high level signal which is applied to the second inputs of NOR gates 302 and 317. The first input of NOR gate 302 has a logic high level signal applied thereto such that the output thereof generates a logic low level signal which is applied to the second input of NOR gate 317. Thus, the output of NOR gate 317 generates a logic low level signal which is inverted in inverter 323 such that a logic high level signal appears on the control terminal H4. NOR gates 303-305, 318-320 and inverters 312-314 and 324-326 operate in an identical manner such that control terminals H3-H0 each carry logic high level signals.

Thus, each of the control terminals H0-H7 carries a logic high level signal except for the H5 control terminal which carries a logic low level signal, indicative of detection of the most significant logic high level signal bit on data lines D6-D13. The H0-H7 terminals are connected to multiplexer 5 via the 120-127 control lines and to encoder 8 via the 130-137 control lines (FIG. 2) such that the row of transmission gate cells 61-66 is enabled.

During compression, the DIRN control signal is at a logic low level such that transistor 106 is disabled, effectively disabling the logic low level signal carried by the D6 data line.

The logic low level signal carried by the D7 data line is transmitted via transmission gate cells 71, 62, 52, 42, 32, 22 and 12 so as to appear as the least significant step bit of the step portion of the compressed PCM word appearing on parallel PCM bus 2.

The logic high level signal carried by the D8 data line is transmitted via cells 81, 72, 63, 53, 43, 33, 23 and 13 so as to appear as the second least significant bit of the step portion of the encoded PCM word on parallel PCM bus 2.

Similarly, the logic high and logic low level signals appearing on data lines D9 and D10 respectively, are transmitted via gates 82, 73, 64, 54, 44, 34, 24, 14 and 84, 75, 65, 55, 45, 35, 25 and 15 respectively so as to appear as the third least significant and most significant bits of the step portions of the encoded PCM word appearing on parallel PCM bus 2.

Also, the logic low level signal on control terminal H5 is encoded via encoder 8, resulting in generation of a chord portion of the PCM word having a three bit value of the form 1 0 1.

As discussed above, in the event of μ-law conversion, an offset value of thirty-three is added to the linear word prior to detection of the most significant logic high bit. The offset adder/subtracter circuit 6 is typically comprised of a series of gated bidirectional full adder cells, in a well known manner.

With reference to FIG. 5 in conjunction with FIG. 2, multiplexer circuit 5 is discussed in detail with reference to the expansion of A-law PCM words.

As discussed above with reference to Tables 1 and 2, A-law PCM words are expanded to form 12 bit linear representations while μ-law words are expanded to form 13 bit linear representations. During expansion of μ-law words the A/μ-law control signal is at a logic low level while the DIRN control signal is at a logic high level. Accordingly, NAND gate 401 is enabled and the output LZ remains at a logic high level. Similarly, transistor 106 (FIG. 2) is enabled such that a logic high level signal is applied to transmission gate cell 11. This results in the A, B, C and D step bits being surrounded by 1's (Table 2).

However, in the event of expansion of A-law PCM words, both the DIRN and A/μ-law control signals are at logic high levels. Thus, in the event of expansion of a PCM word having chord bits of the form 0 0 0, control line 110 is at a logic low level while control lines 111-117 are at logic high levels. The logic low level signal carried by control line 110 is applied to the X0 input of multiplexer cell 402, and appears on the OUT terminal thereof in response to a logic low level DIRN control signal being applied to the select input S. The logic low level signal appearing on the OUT terminal of multiplexer cell 204 is inverted via inverter 403 for application to NAND gate 401. Consequently, the output signal LZ from NAND gate 401 goes to a logic low level. The high level A/μ-law control signal is applied to a first input of NOR gate 404 such that the signal output therefrom to enable line 17 remains at a logic low level.

The A/μ-law control signal is inverted via inverter 405 for application to a first input of an OR gate 406 while the logic low signal output from multiplexer cell 402 is applied to a second input thereof, resulting in generation of a logic low level output signal which is applied to a first input of a further NAND gate 407.

A control signal appearing on the OUT terminal of a further multiplexer cell 408 is inverted via inverter 409 and applied to a second input of NAND gate 407 such that a logic high level signal is applied to enable line 27. Respective outputs of additional multiplexer cells 410–414 are at logic low levels and applied to respective enable lines 37, 47, 57, 67, 77 and 87.

Accordingly, the A, B, C and D step bits carried by PCM bus 2 are translated via cells 15, 14, 13 and 12 to appear on data lines D5–D2 respectively. Also, a logic high level signal is translated via transistor 106 and transmission cell 11 to appear on the D1 data line, while a logic low level signal is translated from the LZ output through cells 16, 25, 34, 43, 52 and 61 so as to appear on the D6 data line. Also, the D7–D13 data lines carry logic low level signals as discussed in detail above.

In the event of expansion of an A-law PCM word having chord bits of the form 0 0 1, the LZ control signal goes to a logic high level while the control signals on enable lines 17 and 27 remain at logic low and logic high levels respectively. Consequently, the most significant bit adjacent to the "A" step bit is transformed to a logic high level.

In the event of expansion of an A-law PCM word with chord bits having a magnitude of two or greater, the LZ control signal remains at a logic high level such that a predetermined one of the enable lines 37, 47, 57, 67, 77 or 87 carries a logic high level signal while the remaining enable lines have logic low level signals applied thereto.

According to a successful embodiment of the invention, the companding circuit was utilized for implementing a PCM gain shifting device wherein a one bit shift of the linear signal resulted in a 6 dB gain level adjustment. According to the successful embodiment, compression and expansion typically took only one microprocessor cycle each, in contrast to the relatively slow prior art serial PCM companding circuits.

A person skilled in the art may conceive of other variations or embodiments of the present invention. For instance, while a six by eight cell array was described according to the preferred embodiment, arrays of various configurations may be realized to compand digital signals having fewer or greater number of bits.

All such embodiments and modifications are believed to be within the sphere and scope of the present invention as defined by the claims appended hereto.

I claim:

1. A circuit for companding digital signals carried by first and second digital signal buses, comprised of:
   (a) means for decoding a first plurality of bits of a compressed digital signal carried by said first digital signal bus and generating a first control signal in response thereto,
   (b) means for encoding a first plurality of bits of a linear digital signal carried by said second digital signal bus and generating a second control signal in response thereto,
   (c) means for receiving one of either said first or second control signals and shifting one of either a further plurality of bits of said compressed signals a predetermined number of locations to the left, or a further plurality of bits of said linear signal a predetermined number of locations to the right, respectively, in response thereto,
   (d) means for applying said shifted bits of the compressed signal to said second signal bus thereby forming a linear respresentation of said compressed signal thereon, and
   (e) means for combining said encoded bits and shifted bits of the linear signal and applying said combined signal to said first signal bus thereby forming a compressed representation of said linear signal thereon.

2. A circuit as defined in claim 1, wherein said means for receiving is comprised of a bidirectional barrel shifter.

3. A circuit as defined in claim 2, wherein said barrel shifter is comprised of an array of bidirectional transmission gate cells, each cell being comprised of a pair of series connected signal ports, a pair of diagonally connected signal ports and a control input.

4. A circuit as defined in claim 3, further including means for receiving and multiplexing said first and second control signals and generating enable signals for enabling predetermined ones of said cells in response thereto.

5. A circuit as defined in claim 4, wherein said array is comprised of eight rows by six columns of transmission gate cells, each cell in a row being connected via the control input thereof to a predetermined control line of said means for receiving and multiplexing, for receiving a predetermined one of said enable signals carried thereon, and each cell in a column being connected in series via said series connected signal ports and each cell also being connected to a cell diagonally adjacent thereto via said diagonally connected signal ports.

6. A circuit as defined in claim 1, wherein said means for encoding further includes means for detecting a most significant logic high level bit of said linear signal carried by said second digital signal bus and in response generating said second control signal in the form of a logic high level signal on one of a plurality of outputs thereof.

7. A circuit as defined in claim 1, further including offset adder/subtracter means for adding and subtracting a predetermined offset signal to said compressed and linear signals respectively in the event said digital signals are μ-law encoded Pulse Code Modulated words.

8. A circuit as defined in claim 1, wherein said compressed digital signal is an eight bit μ-law encoded Pulse Code Modulated word comprised of a sign bit, three chord bits and four step bits.

9. A circuit as defined in claim 1, wherein said compressed digital signal is an eight bit A-law encoded Pulse Code Modulated word comprised of a sign bit, three chord bits and four step bits.

10. A circuit as defined in claim 1, wherein said linear signal is comprised of a sign bit and one of either a further twelve bits representing the linear magnitude of an A-law encoded Pulse Code Modulated word or thirteen bits representing the linear magnitude of a μ-law encoded Pulse Code Modulated word.

11. A circuit as defined in claim 1, wherein said means for decoding is comprised of a decoder circuit for receiving said first plurality of bits of the compressed signal and in response generating said first control signal in the form of a logic high level signal on one of a plurality of outputs thereof.

12. A circuit as defined in claim 3, wherein each cell is further comprised of:
(a) a first transmission gate having one bidirectional terminal thereof connected to a first one of said pair of series connected signal ports and a second bidirectional terminal thereof connected to a first one of said pair of diagonally connected ports,
(b) a second transmission gate having one bidirectional terminal thereof connected to the first one of said pair of diagonally connected ports and a second bidirectional terminal thereof connected to a second one of the pair of diagonally connected ports,
(c) a third transmission gate having one bidirectional terminal thereof connected to the first one of said pair of series connected signal ports and a second bidirectional terminal thereof connected to a second one of the pair of series connected signal ports, and
(d) a fourth transmission gate having one bidirectional terminal thereof connected to the second one of the pair of diagonally connected ports and a second bidirectional terminal thereof connected to the second one of the series connected signal ports.

13. A method for companding digital signals carried by first and second digital signal buses, comprising the steps of:
(a) decoding a first plurality of bits of a compressed digital signal carried by said first digital signal bus and generating a first control signal in response thereto,
(b) encoding a first plurality of bits of a linear digital signal carried by said second digital signal bus and generating a second control signal in response thereto,
(c) receiving one of either said first or second control signals and shifting one of either a further plurality of bits of said compressed signals a predetermined number of bits to the left, or a further plurality of bits of said linear signal a predetermined number of bits to the right, respectively, in response thereto,
(d) applying said shifted bits of the compressed signal to said second signal bus thereby forming a linear respresentation of said compressed signal thereon, and
(e) combining said encoded bits and shifted bits of the linear signal and applying said combined signal to said first signal bus thereby forming a compressed representation of said linear signal thereon.

14. A circuit for companding digital Pulse Code Modulated words carried by a PCM signal bus, comprised of:
(a) a bidirectional parallel processing cell array connected to said PCM signal bus, for receiving step bits of an input digital Pulse Code Modulated word,
(b) a decoder connected to said bus, for receiving said chord bits and generating a first enable signal for enabling an assoiacted row of said array such that said step bits are shifted a predetermined number of locations to the left,
(c) means for receiving a sign bit of said Pulse Code Modulated word from said bus and applying said sign bit in combination with said shifted step bits to a linear signal bus, thereby forming an expanded output linear word thereon,
(d) a leading one detector circuit connected to said linear signal bus, for receiving an input linear word, and generating a second enable signal for enabling an associated row of said array such that predetermined bits of said input linear word are shifted a predetermined number of locations to the right, thereby forming step bits of an output digital Pulse Code Modulated word,
(e) an encoder for receiving said second enable signal and generating output chord bits in response thereto, and
(f) means for receiving a sign bit of said input linear word from said linear bus and applying said bit in combination with said generated chord bits and said formed step bits to said PCM signal bus, thereby forming an output digital Pulse Code Modulated word thereon.

15. A circuit as defined in claim 14, wherein said bidirectional parallel processing cell array is comprised of a barrel shifter.

16. A circuit as defined in claim 15, further including a multiplexer for receiving and applying one of either said first or second enable signals to said barrel shifter.

17. A circuit as defined in claim 14, wherein said bidirectional parallel processing cell array is comprised of eight rows by six columns of interconnected transmission gate cells.

18. A circuit as defined in claim 14, wherein said decoder is a three bit input to eight bit output digital decoder.

19. A circuit as defined in claim 14, wherein said encoder is an eight bit input to three bit output digital encoder.

20. A circuit as defined in claim 5, further including means for disabling a predetermined row of said array and adding/substracting an offset value of thirty-three to said Pulse Code Modulated or linear word respectively, in the event of companding a μ-law digital Pulse Code Modulated word.

21. A circuit as defined in claim 2, wherein said means for encoding further includes means for detecting a most significant logic high level bit of said linear signal carried by said second digital signal bus and in response generating said second control signal in the form of a logic high level signal on one of a plurality of outputs thereof.

22. A circuit as defined in claim 3, wherein said means for encoding further includes means for detecting a most significant logic high level bit of said linear signal carried by said second digital signal bus and in response generating said second control signal in the form of a logic high level signal on one of a plurality of outputs thereof.

23. A circuit as defined in claim 2, further including offset adder/subtracter means for adding and subtracting a predetermined offset signal to said compressed and linear signals respectively in the event said digital signals are μ-law encoded Pulse Code Modulated words.

24. A circuit as defined in claim 3, further including offset adder/subtracter means for adding and subtracting a predetermined offset signal to said compressed and linear signals respectively in the event said digital signals are µ-law encoded Pulse Code Modulated words.

25. A circuit as defined in claim 2, wherein said compressed digital signal is an eight bit µ-law encoded Pulse Code Modulated word comprised of a sign bit, three chord bits and four step bits.

26. A circuit as defined in claim 3, wherein said compressed digital signal is an eight bit µ-law encoded Pulse Code Modulated word comprised of a sign bit, three chord bits and four step bits.

27. A circuit as defined in claim 2, wherein said compressed digital signal is an eight bit A-law encoded Pulse Code Modulated word comprised of a sign bit, three chord bits and four step bits.

28. A circuit as defined in claim 3, wherein said compressed digital signal is an eight bit A-law encoded Pulse Code Modulated word comprised of a sign bit, three chord bits and four step bits.

29. A circuit as defined in claim 2, wherein said linear signal is comprised of a sign bit and one of either a further twelve bits representing the linear magnitude of an A-law encoded Pulse Code Modulated word or thirteen bits representing the linear magnitude of a µ-law encoded Pulse Code Modulated word.

30. A circuit as defined in claim 3, wherein said linear signal is comprised of a sign bit and one of either a further twelve bits representing the linear magnitude of an A-law encoded Pulse Code Modulated word or thirteen bits representing the linear magnitude of a µ-law encoded Pulse Code Modulated word.

31. A circuit as defined in claim 2, wherein said means for decoding is comprised of a decoder circuit for receiving said first plurality of bits of the compressed signal and in response generating said first control signal in the form of a logic high level signal on one of a plurality of outputs thereof.

32. A circuit as defined in claim 3, wherein said means for decoding is comprised of a decoder circuit for receiving said first plurality of bits of the compressed signal and in response generating said first control signal in the form of a logic high level signal on one of a plurality of outputs thereof.

33. A circuit as defined in claim 4, wherein each cell is further comprised of:
   (a) a first transmission gate having one bidirectional terminal thereof connected to a first one of said pair of series connected signal ports and a second bidirectional terminal thereof connected to a first one of said pair of diagonally connected ports,
   (b) a second transmission gate having one bidirectional terminal thereof connected to the first one of said pair of diagonally connected ports and a second bidirectional terminal thereof connected to a second one of the pair of diagonally connected ports,
   (c) a third transmission gate having one bidirectional terminal thereof connected to the first one of said pair of series connected signal ports and a second bidirectional terminal thereof connected to a second one of the pair of series connected signal ports, and
   (d) a fourth transmission gate having one bidirectional terminal thereof connected to the second one of the pair of diagonally connected ports and a second bidirectional terminal thereof connected to the second one of the series connected signal ports.

34. A circuit as defined in claim 5, wherein each cell is further comprised of:
   (a) a first transmission gate having one bidirectional terminal thereof connected to a first one of said pair of series connected signal ports and a second bidirectional terminal thereof connected to a first one of said pair of diagonally connected ports,
   (b) a second transmission gate having one bidirectional terminal thereof connected to the first one of said pair of diagonally connected ports and a second bidirectional terminal thereof connected to a second one of the pair of diagonally connected ports,
   (c) a third transmission gate having one bidirectional terminal thereof connected to the first one of said pair of series connected signal ports and a second bidirectional terminal thereof connected to a second one of the pair of series connected signal ports, and
   (d) a fourth transmission gate having one bidirectional terminal thereof connected to the second one of the pair of diagonally connected ports and a second bidirectional terminal thereof connected to the second one of the series connected signal ports.

35. A circuit as defined in claim 15, wherein said bidirectional parallel processing cell array is comprised of eight rows by six columns of interconnected transmission gate cells.

36. A circuit as defined in claim 16, wherein said bidirectional parallel processing cell array is comprised of eight rows by six columns of interconnected transmission gate cells.

37. A circuit as defined in claim 15, wherein said decoder is a three bit input to eight bit output digital decoder.

38. A circuit as defined in claim 16, wherein said decoder is a three bit input to eight bit output digital decoder.

39. A circuit as defined in claim 15, wherein said encoder is an eight bit input to three bit output digital encoder.

40. A circuit as defined in claim 16, wherein said encoder is an eight bit input to three bit output digital encoder.

41. A circuit as defined in claim 14, further including means for disabling a predetemined row of said array and adding/subtracting an offset value of thirty-three to said Pulse Code Modulated or linear word respectively, in the event of companding a µ-law digital Pulse Code Modulated word.

* * * * *